United States Patent [19]
Yamazaki

[11] Patent Number: 5,912,474
[45] Date of Patent: Jun. 15, 1999

[54] THIN FILM INTEGRATED CIRCUIT INCLUDING AT LEAST TWO P-TYPE TRANSISTORS

[75] Inventor: Shunpei Yamazaki, Tokyo, Japan

[73] Assignee: Semiconductor Energy Laboratory Co., Ltd., Kanagawa-ken, Japan

[21] Appl. No.: 08/967,295

[22] Filed: Nov. 7, 1997

Related U.S. Application Data

[63] Continuation of application No. 08/598,078, Feb. 7, 1996, abandoned.

[30] Foreign Application Priority Data

Feb. 7, 1995 [JP] Japan .................................. 7-043409

[51] Int. Cl.⁶ .................................................. H01L 29/76
[52] U.S. Cl. ............................ 257/72; 257/350; 257/365
[58] Field of Search ............................... 257/66, 72, 347, 257/350, 365

[56] References Cited

U.S. PATENT DOCUMENTS

| | | | |
|---|---|---|---|
| 5,250,835 | 10/1993 | Izawa | 257/365 |
| 5,501,989 | 3/1996 | Takayama et al. | 257/350 |
| 5,528,056 | 6/1996 | Shimada et al. | 257/72 |

*Primary Examiner*—David B. Hardy
*Attorney, Agent, or Firm*—Fish & Richardson P.C.

[57] ABSTRACT

A P-channel thin film transistor is added to a CMOS circuit constituted of a P-channel thin film transistor and an N-channel thin film transistor. By utilizing a voltage drop in the inserted P-channel thin film transistor, the strength of an electric field in the vicinity of the drain of the original P-channel thin film transistor can be weakened, reducing its leak current. This enables suppression of the power consumption of the entire CMOS circuit.

12 Claims, 10 Drawing Sheets

THIN FILM INTEGRATED CIRCUIT INCLUDING AT LEAST TWO P-TYPE TRANSISTORS

This is a continuation of application Ser. No. 08/598,078, filed Feb. 7, 1996, now abandoned.

BACKGROUND OF THE INVENTION

1. Field of the Invention

The present invention relates to a thin film semiconductor integrated circuit for driving an active matrix display device in which circuit the power consumption is made smaller than that of conventional circuits by reducing the off-time leak current of P-channel thin film transistors.

The invention also relates to a thin film semiconductor integrated circuit in which the active layer of each constituent thin film transistor (hereinafter called TFT) is made of a silicon semiconductor that has been crystallized by using a catalyst element for accelerating crystallization of amorphous silicon.

2. Description of the Related Art

The active matrix display device is a device in which switching elements are provided for respective pixels and a signal coming through an image signal line is supplied to the pixels through the switching elements. While conventionally TFTs made of an amorphous silicon semiconductor have been used as the switching elements, in recent years TFTs made of a crystalline silicon semiconductor having high operation speed have been developed.

Manufacture of a crystalline silicon semiconductor is associated with the following problems.

A first problem relates to crystallization of silicon. Crystalline silicon is produced by crystallizing amorphous silicon, and two methods for conducting the crystallization are known. In a first method called an optical annealing method, crystallization is instantaneously effected by application of strong light such as laser light. This method has a deficiency of low mass-productivity because a laser oscillator capable of stably producing high-energy light is not available. In a second method called a thermal annealing method or a solid-phase growth method, amorphous silicon is crystallized by solid-phase growth by thermally annealing it usually at 600° C. or a higher temperature. This method are deficient in that the substrate cost is increased because only the quartz substrate can be used when the thermal annealing temperature is 1,000° C., and that the crystallinity of silicon films obtained is not good. Although a low-cost borosilicate glass substrate can be used when the thermal annealing temperature is 600° C., the crystallization takes more than 24 hours.

A second problem is that a TFT made of crystalline silicon has a large leak current when a reverse-bias voltage is applied to the gate electrode. This is believed due to crystal boundaries, and is the most serious problem because the leak current has great influence on the characteristics and power consumption of a crystalline-silicon-based circuit that constitutes an active matrix display device.

In the case of an N-channel TFT, the leak current with negative $V_{GS}$ is determined by a current flowing through a PN junction between an induced P-type surface layer of a semiconductor thin film and N-type layers of the source and drain regions. Since many traps exist in the semiconductor thin film (particularly in crystal boundaries), this PN junction is incomplete, likely causing a junction leak current. As the gate electrode is negatively biased more deeply, the leak current increases. This is due to a phenomenon that the carrier density of the P-type surface layer formed on the semiconductor thin film is increased to lower the energy barrier height of the PN junction, and resulting electric field concentration increases the junction leak current.

The leak current that occurs in this manner greatly depends on the source-drain voltage. For example, it is known that the leak current sharply increases as the source-drain voltage of a TFT is increased. That is, there may occur a case in which a leak current with a 10-V source-drain voltage is more than 10 times, rather than two times, that with a 5-V source-drain voltage. This nonlinearity also depends on the gate voltage. In general, the difference between leak currents with 5-V and 10-V source-drain voltages increases as the gate electrode is reversely biased more deeply (in an N-channel TFT, as the gate electrode is supplied with a larger negative voltage).

As for the first problem, it is known that the crystallization of amorphous silicon can be accelerated by adding to it a very small amount of nickel (Ni), platinum (Pt), iron (Fe), cobalt (Co), palladium (Pd), or the like (Japanese Unexamined Patent Publication No. Hei. 6-244104). By adding such a catalyst element, crystallization can be effected by thermal annealing typically in 4 hours at 550° C., or in some cases, in a shorter period at a lower temperature. In addition, it has been found that while an amorphous silicon film thinner than 1,000 Å can hardly be crystallized by the conventional thermal annealing method, an amorphous silicon film having a thickness of less than 1,000 Å, typically 300 to 800 Å, can be crystallized sufficiently by adding a catalyst element to it.

My investigations have revealed that in manufacturing TFTs by using silicon that has been crystallized by adding a catalyst element, it is preferred that the concentration of the catalyst element remaining in silicon be $1 \times 10^{15}$ to $5 \times 10^{19}$ atoms/cm$^3$ from the viewpoints of the crystallization step and the characteristics and reliability.

While the first problem has been solved in the above manner, the second problem remains unsolved. Conversely, the resolution of the first problem has caused a new problem of a large variation of the leak current. This is due to the following phenomenon. In the case of a silicon film crystallized by adding a catalyst element, crystal growth proceeds in a needle-like manner (in a grain-like manner in the conventional thermal annealing method) and a resulting crystal has a major-axis diameter of several micrometers or larger (less than 1 μm in the conventional thermal annealing method). Therefore, the TFT characteristics are more influenced by crystal boundaries. FIG. 13 shows a variation of the leak current of a conventional P-channel TFT. As is apparent from FIG. 13, the leak current varies by two orders.

As described above, even where a driving circuit of an active matrix display device is constructed by CMOS (complementary metal oxide semiconductor) TFTs, the power consumption of the entire circuit is large because large leak currents flow through P-channel TFTs even in an off state. Examples of products having an active matrix display device are a notebook-type personal computer and a portable information terminal. At present, the power consumption of the active matrix display device occupies most of the entire power consumption. Therefore, to allow a battery to drive a product for a long time, it is now desired that the power consumption of the active matrix display device be reduced. Further, in view of the trend of saving resources on an earth scale, it is indispensable to reduce the power consumption of the active matrix display device, which is expected to become a next-generation display.

SUMMARY OF THE INVENTION

As described above, the leak current of a P-channel TFT can be reduced by decreasing the source-drain voltage. To this end, an additional P-channel TFT is inserted at a connection point of drain electrodes of a P-channel TFT and an N-channel TFT. Since the source-drain voltage for all the P-channel TFTs is constant, the source-drain voltage for each P-channel TFT is inversely proportional to the number of P-channel TFTs. Specific approaches will be described below.

As shown in FIG. 1, in an inverter circuit constituted of TFTs, a P-channel TFT 102 is inserted between a P-channel TFT 101 and an N-channel TFT 103. By virtue of a voltage drop of the inserted P-channel TFT 102, an electric field in the vicinity of the drain of the P-channel TFT 101 becomes weaker. Thus, the leak current is reduced.

As shown in FIG. 3, in a NAND circuit constituted of TFTs, P-channel TFTs 302 and 306 are inserted between an N-channel TFT 303 and P-channel TFTs 301 and 305. By virtue of voltage drops of the inserted P-channel TFTs 302 and 306, electric fields in the vicinity of the drains of the P-channel TFTs 301 and 305 become weaker. Thus, the leak current is reduced.

As shown in FIG. 6, in a transfer gate circuit constituted of TFTs, a P-channel TFT 602 is added. By virtue of a voltage drop of the added P-channel TFT 602, an electric field in the vicinity of the drain of a P-channel TFT 601 becomes weaker. Thus, the leak current is reduced.

The invention provides remarkable advantages when applied to a TFT whose active layer is formed in a silicon film that has been crystallized by using a catalyst element for accelerating crystallization of silicon. This is because when a TFT is formed by using a crystalline silicon film that has been crystallized by adding a catalyst element, its off-current characteristic is essentially poor due to trap states caused by the catalyst element.

The metal element(s) used for accelerating the crystallization of silicon may be one or a plurality of elements selected from Fe, Co.

Ni, Ru, Rh, Pd, Os, Ir, Pt, Cu and Au. In particular, Ni provide remarkable advantages and high reproducibility, which is beneficial in terms of practicality.

Among the methods of introducing the above catalyst elements, all of which are metal elements, into amorphous silicon are:

Performing a hydrogen plasma treatment by using a plasma processing apparatus having an electrode made of one or some of the above catalyst elements.

Forming a thin film of or containing one or some of the above catalyst elements on the surface of an amorphous silicon film by sputtering, deposition, or CVD.

Applying a solution containing one or some of the above catalyst elements to an amorphous silicon film.

In particular, the last method of using a solution can provide highly reproducible results, because the concentration of an introduced element can easily be controlled by preliminarily adjusting its density in the solution.

DETAILED DESCRIPTION OF THE PREFERRED EMBODIMENTS

Embodiment 1

Figure 1:
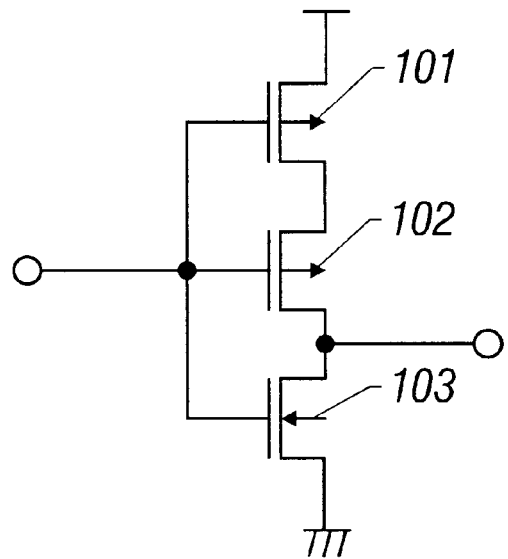
FIGS. 1 and 2 show examples of inverter circuits constituted of TFTs according to the present invention.

FIG. 1 shows an example of an inverter circuit constituted of TFTs, in which a P-channel TFT 102 is connected to the input and inserted between a P-channel TFT 101 and an N-channel TFT 103. Since the P-channel TFT 102 has a voltage drop, an electric field in the vicinity of the drain of the P-channel TFT 101 can be weakened. Therefore, the leak current can be reduced. The P-channel TFT 102 may be used in a plural number.

FIGS. 11A to 11E are sectional views showing a manufacturing process (process-1) of a P-channel TFT and an N-channel TFT used in this embodiment. First, a 2,000-Å-thick silicon oxide undercoat film 1102 was formed on a substrate (Corning 7059) 1101 by sputtering. If the substrate 1101 is annealed at a temperature higher than the strain temperature and then slowly cooled to a temperature below the strain temperature at a rate of 0.1 to 1.0° C./min before or after the undercoat film deposition, its contraction in later steps with temperature increase (including an infrared light illumination step of the invention) is reduced, facilitating mask registration. In the case of the Corning 7059 substrate, it is preferred that the substrate is annealed at 620 to 660° C. for 1 to 4 hours, then slowly cooled at a rate of 0.1 to 1.0° C./min, more preferably 0.1 to 0.3° C./min, and taken out when the temperature is reduced to 450 to 590° C.

Figure 11A:
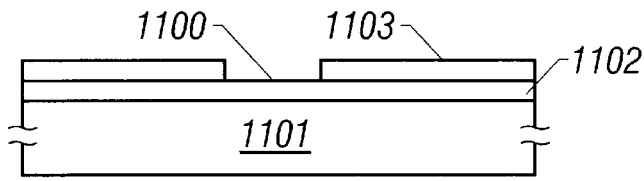
FIGS. 11A to 11E are sectional views showing a manufacturing process (process-1) of TFTs according to the invention.

After the deposition of the undercoat film 1102, a mask 1103 was formed by, for instance, a silicon nitride film so as to have a slit-like portion for partially exposing the undercoat film 1102. Thus, a state shown in FIG. 11A is obtained. If the state of FIG. 11A is viewed from above, the undercoat film 1102 is partially exposed through the slit-like portion of the mask 1103 and the other portion of the undercoat film 1102 is masked. After the mask 1103 was formed, a nickel silicide film ($NiSi_x$; $0.4 \leq x \leq 2.5$, for instance, x=2.0) having a thickness of 5 to 200 Å, for instance, 20 Å, was selectively deposited in an area 1100 by sputtering. In this state, selective introduction of nickel is to be effected in the area 1100. (FIG. 11A)

Subsequently, the mask 1103 was removed, and an intrinsic (I-type) amorphous silicon film 1104 having a thickness of 300 to 1,500 Å, for instance, 500 Å, was deposited by plasma CVD. Then, the amorphous silicon film 1104 was crystallized by annealing it at 550° C. for 4 to 8 hours in an inert gas atmosphere (nitrogen or argon; atmospheric pressure). In this step, crystallization of the amorphous silicon film 1104 proceeded perpendicularly to the substrate 1101 in the area 1100 where the nickel suicide film had been selectively deposited. In the area other than the area 1100, crystal growth proceeded horizontally (parallel to the substrate 1101) from the area 1100 as indicated by arrows 1105. (FIG. 11B)

As in the case of this embodiment, a crystalline silicon film that has been crystallized by using a catalyst element for accelerating crystallization of silicon does not have the same crystal structure as a single crystal wafer, hydrogen (or a halogen element) for neutralizing dangling bonds is contained therein at a concentration of 0.001 to 5 atomic %.

Figure 11B:
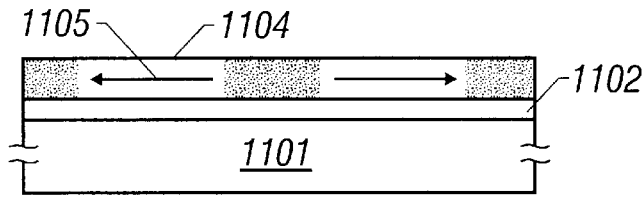

After completion of the crystallization step shown in FIG. 11B, the silicon film was patterned into an island-like active layer 1104' of TFTs. It is important that crystal growth tip portions (i.e., boundaries between the crystalline silicon regions and the amorphous silicon regions where the nickel concentration is high) do not exist in portions to form channel forming regions. This prevents carriers that move between the source and the drain from being influenced by nickel in the channel forming region. The size of the active layer 1104' is determined in consideration of the channel length and width of the TFTs. A small active layer had a size of 50 $\mu$m×20 $\mu$m, and a large active layer had a size of 100 $\mu$m×1,000 $\mu$m.

Figure 11C:
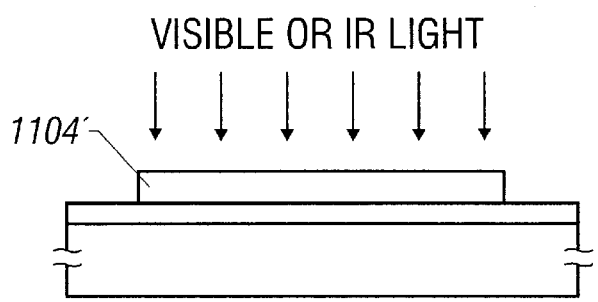

The active layer 1104' was formed on the substrate 1101 in a necessary number and a prescribed pattern. The crystallization of the active layer 1104' was further accelerated by illuminating it with infrared light having a peak in a range of 0.5 to 4 $\mu$m, in this embodiment 0.8 to 1.4 m, for 30 to 180 sec. The temperature was set at 800 to 1,300° C., typically 900 to 1,200° C. (for example, 1,100° C.). To make the surface of the active layer 1104' better, the illumination was performed in a $H_2$ atmosphere. In this step, the heating of the glass substrate 1101 can be minimized because only the active layer 1104' is heated. This step is effective in reducing defects and dangling bonds in the active layer 1104'. (FIG. 11C)

Thereafter, a 1,000-Å-thick silicon oxide film 1106 to form gate insulating films was deposited by plasma CVD. Material gases of the CVD were TEOS (tetraethoxy silane, $Si(OC_2H_5)_4$) and oxygen, and the substrate temperature during the deposition was set at 300 to 550° C., for instance, 400° C.

After the deposition of the silicon oxide film 1106 to form gate insulating films, optical annealing by illumination with visible/near infrared light was performed again. Energy states existing mainly at the boundary between silicon oxide film 1106 and the active layer 1104' and in its vicinity were effectively eliminated by this annealing. This is very advantageous to the insulated gate field effect semiconductor device in which the characteristics of the boundary between the gate insulating film and the channel forming region are very important.

Subsequently, an aluminum film (containing scandium at 0.01 to 0.2%) having a thickness of 6,000 to 8,000 Å, for instance. 6,000 Å was deposited by sputtering, and patterned into gate electrodes 1107 and 1109. Further, the surfaces of the gate electrodes 1107 and 1109 were anodized in an ethylene glycol solution containing tartaric acid at 1 to 5%, to form oxide layers 1108 and 1110. The obtained oxide layers 1108 and 1110 were 2,000 Å in thickness. This thickness of the oxide layers 1108 and 1110 determines the length of offset gate regions in a later ion doping step; that is, the length of the offset gate regions can be determined by the above anodic oxidation step.

Then, impurities for imparting P-type conductivity and N-type conductivity were introduced into active layer regions (for the source and drain and the channel) by ion doping (or plasma doping) in a self-aligned manner by using, as a mask, the gate electrode portions, i.e., the gate electrode 1107 and the oxide layer 1108 covering it and the gate electrode 1109 and the oxide layer 1110 covering it. Doping gases were phosphine ($PH_3$) and diborane ($B_2H_6$). In the former case, the acceleration voltage was set at 60 to 90 kV, for instance, 80 kV. In the latter case, the acceleration voltage was set at 40 to 80 kV, for instance, 65 kV. The dose was $1\times10^{15}$ to $8\times10^{15}$ cm$^{-2}$, for instance, $2\times10^{15}$ cm$^{-2}$ for phosphorus and $5\times10^{15}$ for boron. In conducting the doping, the active layer 1104' was selectively doped with the respective elements by covering its portion not to be doped with a photoresist. As a result, N-type impurity regions 1114 and 1116 and P-type impurity regions 1111 and 1113 were formed; that is, a P-channel TFT (PTFT) region and an N-channel TFT (NTFT) region were formed.

Figure 11D:
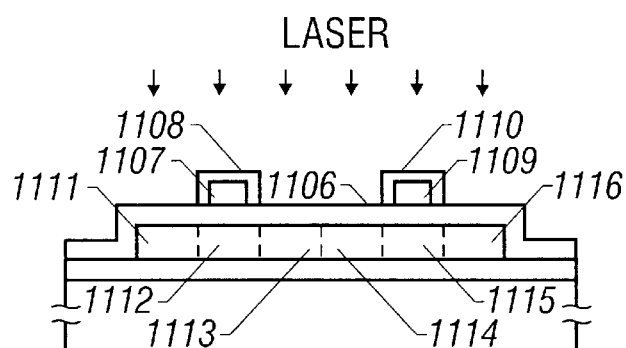

Thereafter, annealing was performed by illumination with laser light. Although a KrF excimer laser (wavelength: 248 nm; pulse width: 20 nsec) was used in this embodiment, other lasers may also be used. As for the laser light illumination conditions, the energy density was 200 to 400 mJ/cm$^2$, for instance, 250 mJ/cm$^2$ and 2 to 10 shots, for instance, 2 shots, were applied to each location. During the laser light illumination, the substrate may be heated to 200 to 450° C. to enhance the annealing effects. (FIG. 11D)

The above step may be replaced by lamp annealing by visible/near infrared light. Since visible/near infrared light is easily absorbed by crystallized silicon or amorphous silicon added with phosphorus or boron at $10^{19}$ to $10^{21}$ cm$^{-3}$, the lamp annealing can provide annealing effects equivalent to those of the thermal annealing of more than 1,000° C. It is believed that if amorphous silicon is added with phosphorus or boron, it sufficiently absorbs even near infrared light due to scattering by impurities. This supposition is well based because it appears black by visual observation. On the other hand, since the glass substrate hardly absorbs near infrared light, it is not heated to a high temperature. With an additional advantage of short processing time, the lamp annealing is most suitable for a step where contraction of the glass substrate causes serious problems.

Figure 11E:
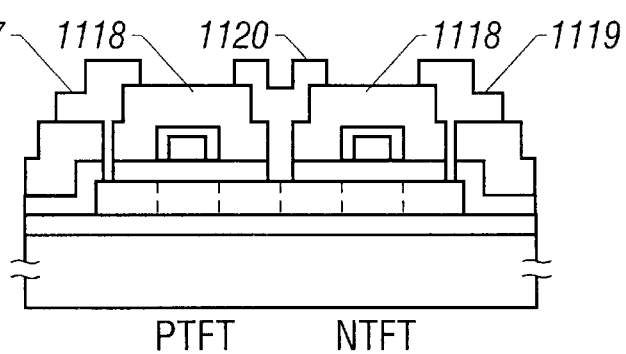

Subsequently, a 6,000-Å-thick silicon oxide film 1118 as an interlayer insulating film was formed by plasma CVD. Alternatively, the interlayer insulating film may be a polyimide film or a two-layer film of silicon oxide and polyimide. After formation of contact holes, electrodes and wiring lines 1117, 1119 and 1120 of the TFTs were formed with a metal material such as a multilayer film of titanium nitride and aluminum. Finally, annealing was performed at 350° C. for 30 minutes in a hydrogen atmosphere of 1 atm, to complete a semiconductor circuit having complementary TFTs. (FIG. 11E)

In the above TFT manufacturing method, an important feature is that dangling bonds produced by the respective steps are neutralized in the later step by heating the substrate at 250 to 400° C. in a hydrogen atmosphere.

In this embodiment, Ni is introduced such that the thin film (hard to observe as a film because it is extremely thin) containing Ni is selectively formed on the undercoat film 1102 that exists under the amorphous silicon film 1104 and crystal growth is caused to start from this portion. Alternatively, a nickel silicide film may be selectively deposited after formation of the amorphous silicon film 1104. That is, crystal growth may be started from either the top or bottom surface of the amorphous silicon film 1104. As a further alternative, nickel ions may be selectively introduced, by ion doping, into the inside of the amorphous silicon film 1104 which has been deposited in advance. This method has an advantage that the nickel concentration can be controlled precisely. Further, plasma processing or CVD may be employed.

The TFTs of FIGS. 11A to 11E have features that the crystal growth is effected parallel with the film plane and carriers move in the same direction. Since this crystal growth proceeds in a columnar or needle-like manner, carriers moving in that direction are hardly influenced by crystal boundaries. Therefore, TFTs having a large mobility can be obtained.

FIGS. 12A to 12D are sectional views showing another manufacturing process (process-2) of a P-channel TFT and an N-channel TFT used in this embodiment. First, a 2,000-Å-thick silicon oxide undercoat film 1202 was formed on a substrate (Corning 7059) 1201 by sputtering. If the substrate 1201 is annealed at a temperature higher than the strain temperature and then slowly cooled to a temperature below the strain temperature at a rate of 0.1 to 1.0° C./min before or after the undercoat film deposition, its contraction in later steps with temperature increase (including an infrared light illumination step of the invention) is reduced. facilitating mask registration. In the case of the Corning 7059 substrate, it is preferred that the substrate is annealed at 620 to 660° C. for 1 to 4 hours, then slowly cooled at a rate of 0.1 to 1.0° C./min, more preferably 0.03 to 0.3° C./min, and taken out when the temperature is reduced to 400 to 500° C.

Thereafter, an intrinsic (I-type) amorphus silicon film 1203 having a thickness of 300 to 1,500 Å, for instance, 800 Å, was deposited by plasma CVD. And a silicon oxide film 1204 having a thickness of 100 to 800 Å, for instance, 200 Å, was deposited thereon by plasma CVD. This film serves as a protection film, i.e., prevents roughening of the film surface in a later thermal annealing step.

Figure 12A:
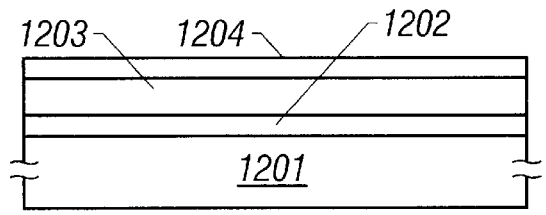
FIGS. 12A to 12D are sectional views showing a manufacturing process (process-2) of TFTs according to the invention.

Thereafter, thermal annealing was performed at 600° C. for 4 hours in a nitrogen atmosphere (atmospheric pressure). As a result, excessive hydrogen was removed from the silicon film and the film was given a low degree of crystallinity. However, an analysis of the silicon film by Raman scattering spectroscopy did not produce any clear peak resulting from the silicon crystal unlike the case of a polycrystalline silicon coating that is crystallized at a ratio of more than 90%. In this state, the crystallinity of the film is such that at least nuclei for crystal growth have been effected but the crystallized area is only less than 50%, typically 1 to 10%. An observation with a TEM (transmission electron microscope) showed existence of fine crystals of less than 1,000 Å, typically 20 to 100 Å. To amplify the above crystallization by nucleus growth by a factor of 3 to 30, it was effective to preliminarily introduce silicon ions at a dose of $1\times10^{14}$ to $1\times10^{16}$ cm$^{-2}$ by ion implantation. (FIG. 12A)

After the above step, the silicon film was patterned into an island-like active layer 1205 for TFTs. The size of the active layer 1205 is determined in consideration of the channel length and width of the TFTs. A small active layer had a size of 50 μm×20 μm, and a large active layer had a size of 100 μm×1,000 μm. In this manner, many active layers 1205 were formed on the substrate 1201.

Figure 12B:
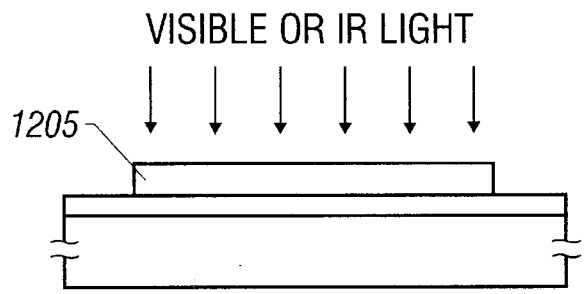

The active layer 1205 was crystallized by illuminating it with infrared light having a peak in a range of 0.6 to 4 μm, in this embodiment 0.8 to 1.4 μm, for 30 to 180 sec. The temperature was set at 800 to 1,300° C., typically 900 to 1,200° C. (for example, 1,100° C.). To make the surface of the active layer 1205 better, the illumination was performed in a H$_2$ atmosphere. In this step, the heating of the glass substrate 1201 can be minimized because only the active layer 1205 is heated. This step is effective in reducing defects and dangling bonds in the active layer 1205. (FIG. 12B)

A halogen lamp was used as a source of infrared light. The intensity of visible/near infrared light was so adjusted that the temperature on a monitoring single crystal silicon wafer became 800 to 1,300° C., typically 900 to 1,200° C. More specifically, the temperature of a thermocouple buried in the silicon wafer was monitored, and fed back to the infrared light source.

It is preferred that during the infrared light illumination the subject surface be coated with a silicon oxide or silicon nitride film as a protection film. This is to provide better surface states of the silicon film 1205. Although in this embodiment the illumination was performed in a H$_2$ atmosphere to allow the silicon film 1205 to have better surface states, HCl of 0.1 to 10 volume %, some other hydrogen halogenide, or a compound of fluorine, chlorine, or bromine may be mixed into the H$_2$ atmosphere.

In this visible/near infrared light illumination step, the heating of the glass substrate 1201 can be minimized because only the crystallized silicon film is heated. This step is effective in reducing defects and dangling bonds in the silicon film. It is also effective in reducing defects to perform hydrogen annealing at 200 to 500° C., typically 350° C., after completion of the RTA step. The same effects can be obtained by performing hydrogen ion doping at a dose of $1\times10^{13}$ to $1\times10^{15}$ cm$^{-2}$ and then a thermal treatment at 200 to 300° C.

After the RTA step, a 1,000-Å-thick silicon oxide film 1206 to form gate insulating films was deposited by plasma CVD. Material gases of the CVD were TEOS (tetraethoxy silane, Si(OC$_2$H$_5$)$_4$) and oxygen, and the substrate temperature during the deposition was set at 300 to 550° C., for instance, 400° C.

After the deposition of the silicon oxide film 1206 to form gate insulating films, optical annealing by illumination with visible/near infrared light was performed again under the same conditions as in the above RTA step. Energy states existing mainly at the boundary between silicon oxide film 1206 and the silicon film 1205 and in its vicinity were effectively eliminated by this annealing. This is very advantageous to the insulated gate field effect semiconductor device in which the characteristics of the boundary between the gate insulating film and the channel forming region are very important.

Subsequently, an aluminum film (containing a rare earth element of group IIIa of the periodic table at 0.01 to 0.25%) having a thickness of 6,000 to 8,000 Å, for instance, 6,000 Å was deposited by sputtering, and patterned into gate electrodes 1207 and 1209. Further, the surfaces of the aluminum electrodes 1207 and 1209 were anodized in an ethylene glycol solution containing tartaric acid at 1 to 5%, to form oxide layers 1208 and 1210. The obtained oxide layers 1208 and 1210 were 2,000 Å in thickness. This thickness of the oxide layers 1208 and 1210 determines the length of offset gate regions in a later ion doping step; that is, the length of the offset gate regions can be determined by the above anodic oxidation step.

Then, impurities for imparting P-type conductivity and N-type conductivity were introduced into the silicon film 1205 by ion doping (or plasma doping) in a self-aligned manner by using, as a mask, the gate electrode portions, i.e., the gate electrode 1207 and the oxide layer 1208 covering it and the gate electrode 1209 and the oxide layer 1210 covering it. Doping gases were phosphine ($PH_3$) and diborane ($B_2H_6$). In the former case, the acceleration voltage was set at 60 to 90 kV, for instance, 80 kV. In the latter case, the acceleration voltage was set at 40 to 80 kV, for instance, 65 kV. The dose was $1\times10^{15}$ to $8\times10^{15}$ $cm^{-2}$, for instance, $2\times10^{15}$ $cm^{-2}$ for phosphorus and $5\times10^{15}$ for boron. In conducting the doping, the silicon film 1205 was selectively doped with the respective elements by covering its portion not to be doped with a photoresist. As a result, N-type impurity regions 1214 and 1216 and P-type impurity regions 1211 and 1213 were formed; that is, a P-channel TFT (PTFT) region and an N-channel TFT (NTFT) region were formed.

Figure 12C:
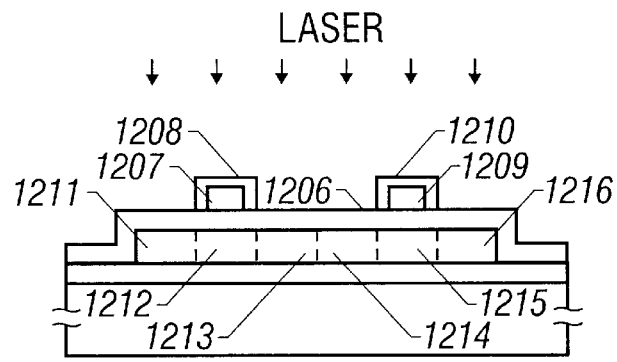

Thereafter, annealing was performed by illumination with laser light. Although a KrF excimer laser (wavelength: 248 nm; pulse width: 20 nsec) was used in this embodiment, other lasers may also be used. As for the laser light illumination conditions, the energy density was 200 to 400 $mJ/cm^2$, for instance, 250 $mJ/cm^2$ and 2 to 10 shots, for instance, 2 shots, were applied to each location. During the laser light illumination, the substrate may be heated to 200 to 450° C. to enhance the annealing effects. (FIG. 12C)

The above step may be replaced by lamp annealing by visible/near infrared light. Since visible/near infrared light is easily absorbed by crystallized silicon or amorphous silicon added with phosphorus or boron at $10^{17}$ to $10^{21}$ $cm^{-3}$, the lamp annealing can provide annealing effects equivalent to those of the thermal annealing of more than 1,000° C. It is believed that if amorphous silicon is added with phosphorus or boron, it sufficiently absorbs even near infrared light due to scattering by impurities. This supposition is well based because it appears black by visual observation. On the other hand, since the glass substrate hardly absorbs near infrared light, it is not heated to a high temperature. With an additional advantage of short processing time, the lamp annealing is most suitable for a step where contraction of the glass substrate causes serious problems.

Figure 12D:
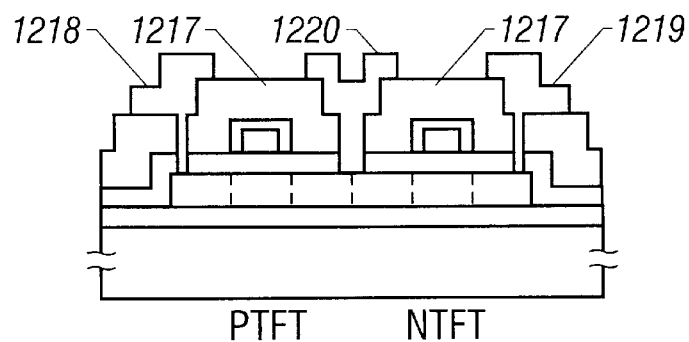

Subsequently, a 6,000-Å-thick silicon oxide film 1217 as an interlayer insulating film was formed by plasma CVD. Alternatively, the interlayer insulating film may be a polyimide film or a two-layer film of silicon oxide and polyimide. After formation of contact holes, electrodes and wiring lines 1218, 1219 and 1220 of the TFTs were formed with a metal material such as a multilayer film of titanium nitride and aluminum. Finally, annealing was performed at 350° C. for 30 minutes in a hydrogen atmosphere of 1 atm, to complete a semiconductor circuit having complementary TFTs. (FIG. 12D)

In the invention, it is important that dangling bonds produced by the optical annealing step by visible/near infrared light illumination are neutralized in the later step by adding hydrogen by heating the substrate at 250 to 400° C. in a hydrogen atmosphere. In this manner, the invention has improved the mass-productivity, and has made it possible to reduce a variation of the leak current in a state that the gate electrode is given 0 V or reversely biased (supplied with a negative voltage in the case of an NTFT) by one to two orders from the case of the conventional method.

Figure 15:
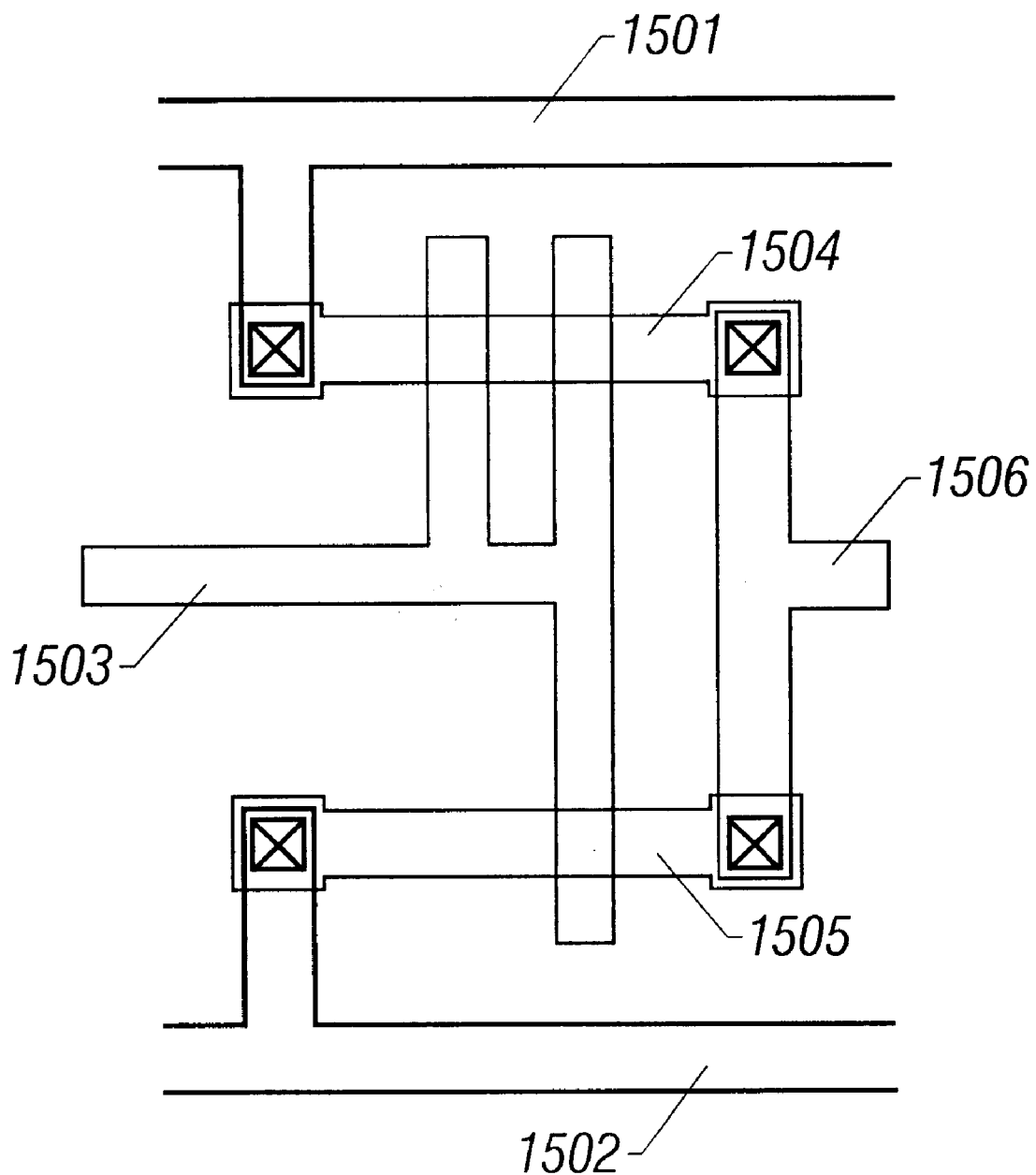
FIG. 15 shows an example of a pattern of an inverter circuit according to the invention.

FIG. 15 shows an example of a pattern of an inverter circuit according to this embodiment. Reference numeral 1501 denotes a drain line for supplying a drain voltage, and numeral 1502 denotes a grounding line for supplying a grounding potential. A gate electrode 1503 assumes a comb-like shape. A pair of P-type semiconductor regions 1504 are so provided as to traverse two legs of the comb-like gate electrode 1503, to constitute two P-channel TFTs. A pair of N-type semiconductor regions 1505 are so provided as to traverse one leg of the gate electrode 1503, to constitute one N-channel TFT. One of the pair of P-type semiconductor regions 1504 is connected to the drain line while the other P-type semiconductor region 1504 is connected to an output line 1506. One of the pair of N-type semiconductor regions 1505 is connected to the grounding line 1502 while the other N-type semiconductor region 1505 is connected to the output line 1506.

Embodiment 2

Figure 2:
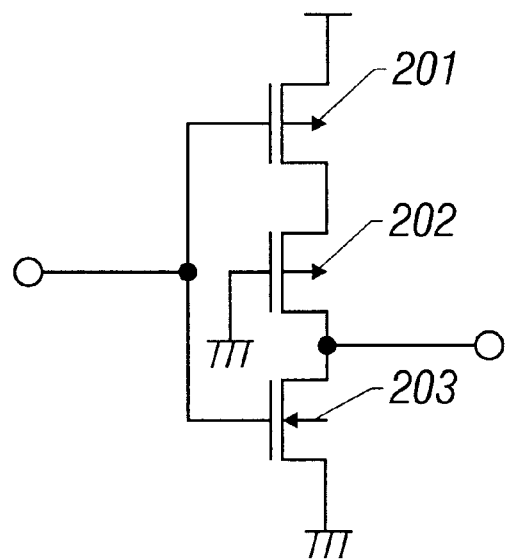

FIG. 2 shows an example of an inverter circuit constituted of TFTs, in which a P-channel TFT 202 that is always made ON-state is inserted between a P-channel TFT 201 and an N-channel TFT 203. By virtue of a voltage drop of the P-channel TFT 202, an electric field in the vicinity of the drain of the P-channel TFT 201 can be weakened. reducing a leak current. The P-channel TFT 202 may be provided in a plural number.

Embodiment 3

Figure 3:
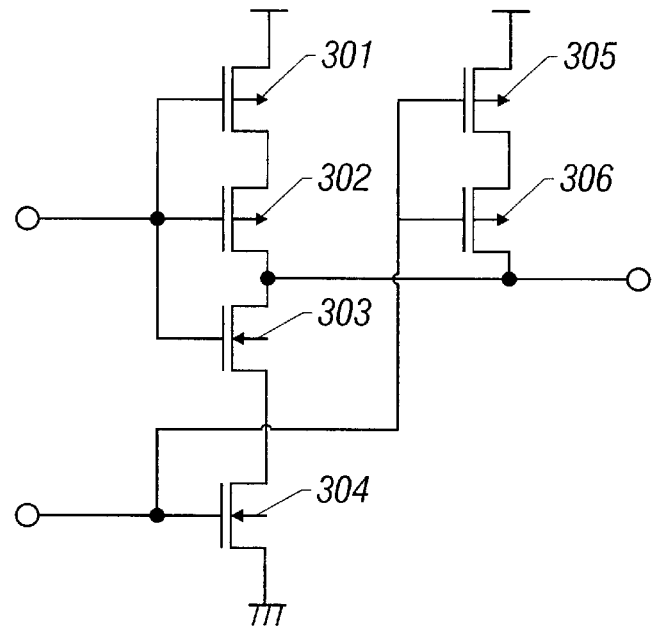
FIGS. 3 to 5 show examples of NAND circuits constituted of TFTs according to the invention.

FIG. 3 shows an example of a NAND circuit constituted of TFTs, in which P-channel TFTs 302 and 306 connected to the input are inserted between an N-channel TFT 303 and a P-channel TFT 301 and between the N-channel TFT 303 and a P-channel TFT 305. respectively. By virtue of voltage drops of the P-channel TFTs 302 and 306, electric fields in the vicinity of the drains of the P-channel TFTs 301 and 305 can be weakened, to reduce leak currents. The number of P-channel TFTs 302 and 306 may be three or more.

Embodiment 4

Figure 4:
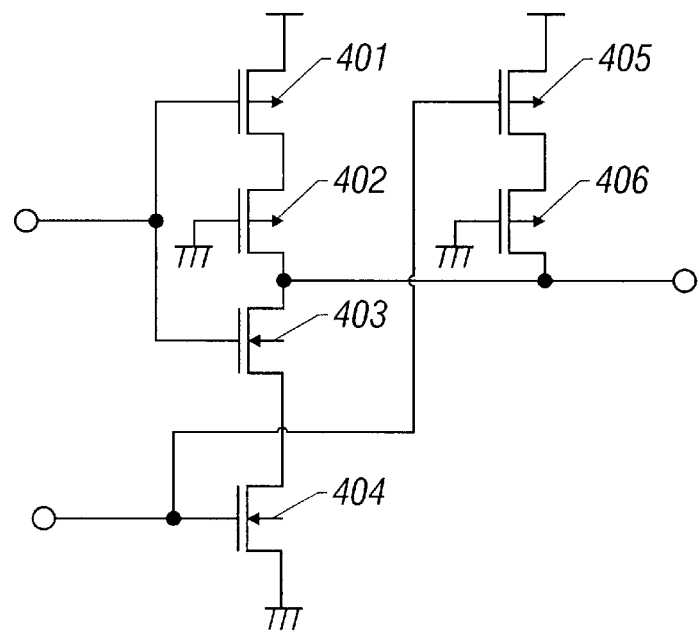

FIG. 4 shows an example of a NAND circuit constituted of TFTs, in which P-channel TFTs 402 and 406 that are always made ON-state are inserted between an N-channel TFT 403 and a P-channel TFT 401 and between the N-channel TFT 403 and a P-channel TFT 405, respectively. By virtue of voltage drops of the P-channel TFTs 402 and 406, electric fields in the vicinity of the drains of the P-channel TFTs 401 and 405 can be weakened, to reduce leak currents. The number of P-channel TFTs 402 and 406 may be three or more.

Embodiment 5

Figure 5:
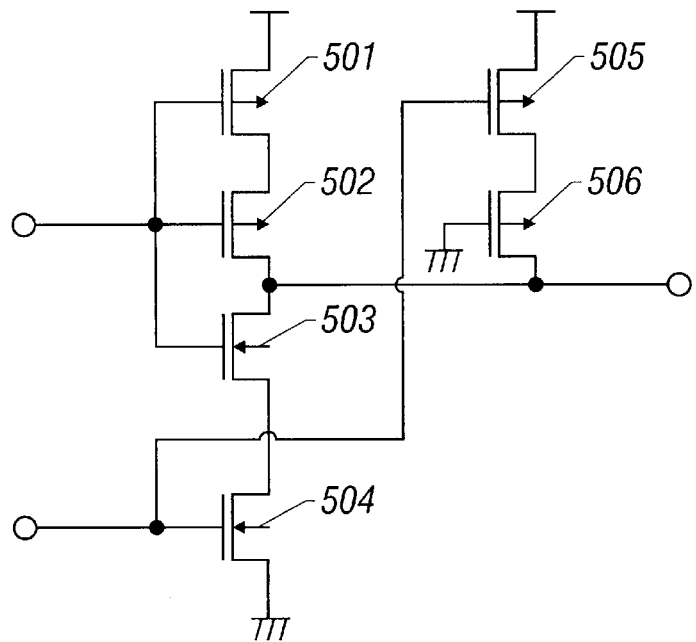

FIG. 5 shows an example of a NAND circuit constituted of TFTs, in which a P-channel TFT 502 connected to the input and a P-channel TFT 506 that is always made ON-state is inserted between an N-channel TFT 503 and a P-channel TFT 501 and between the N-channel TFT 503 and a P-channel TFT 505, respectively. By virtue of voltage drops of the P-channel TFTs 502 and 506, electric fields in the vicinity of the drains of the P-channel TFTs 501 and 505 can be weakened, to reduce leak currents. The number of P-channel TFTs 502 and 506 may be three or more.

Embodiment 6

Figure 6:
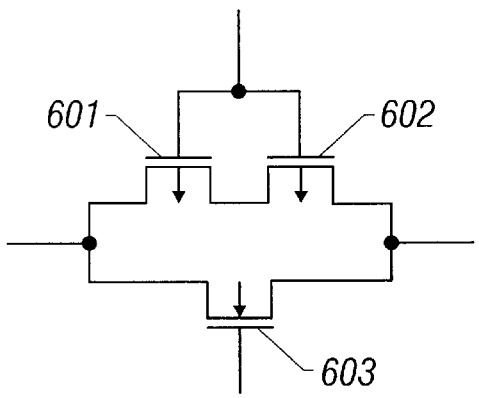
FIGS. 6 and 7 show examples of transfer gate circuits constituted of TFTs according to the invention.

FIG. 6 shows an example of a transfer gate circuit constituted of TFTs, in which a P-channel TFT 602 is inserted between the input and a P-channel TFT 601. Reference numeral 603 denotes an N-channel TFT 601. By virtue of a voltage drop of the P-channel TFT 602, an electric field in the vicinity of the drain of the P-channel TFT 601 can be weakened, reducing a leak current. The P-channel TFT 602 may be provided in a plural number.

Embodiment 7

Figure 7:
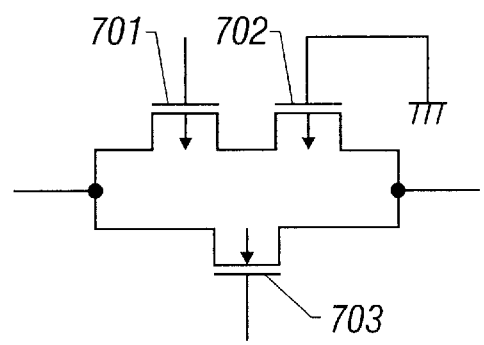

FIG. 7 shows an example of a transfer gate circuit constituted of TFTs, in which a P-channel TFT 702 that is always made ON-state is inserted between the input and a P-channel TFT 701. Reference numeral 703 denotes an N-channel TFT. By virtue of a voltage drop of the P-channel TFT 702, an electric field in the vicinity of the drain of the P-channel TFT 701 can be weakened, reducing a leak current. The P-channel TFT 702 may be provided in a plural number.

Embodiment 8

Figure 8:
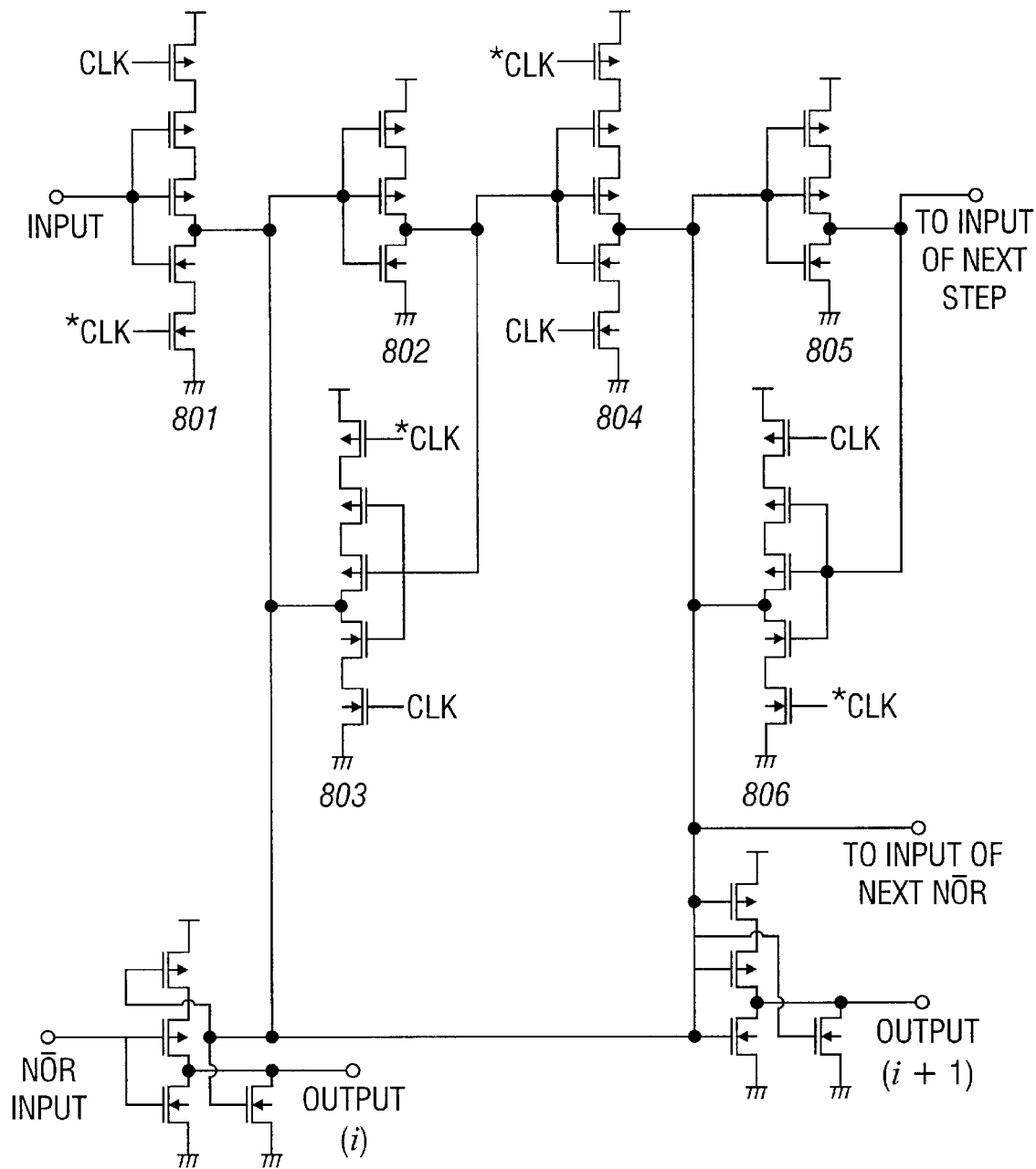
FIGS. 8 to 10 show examples of parts of shift register circuits constituted of TFTs according to the invention.

FIG. 8 is a circuit diagram showing the first stage of a shift register constituted of TFTs. A P-channel TFTs is inserted between a P-channel TFT and an N-channel TFT which constitute each of clocked inverters 801, 803, 804 and 806 and inverters 802 and 805. By virtue of a voltage drop of the inserted P-channel TFT, an electric field in the vicinity of the P-channel TFT can be weakened, reducing a leak current. Although in this embodiment an input signal is supplied to the gate electrode of the inserted P-channel TFT, a P-channel TFT that is always made ON-state may be inserted as in Embodiment 2. Further, a plurality of P-channel TFTs may be inserted.

Embodiment 9

Figure 9:
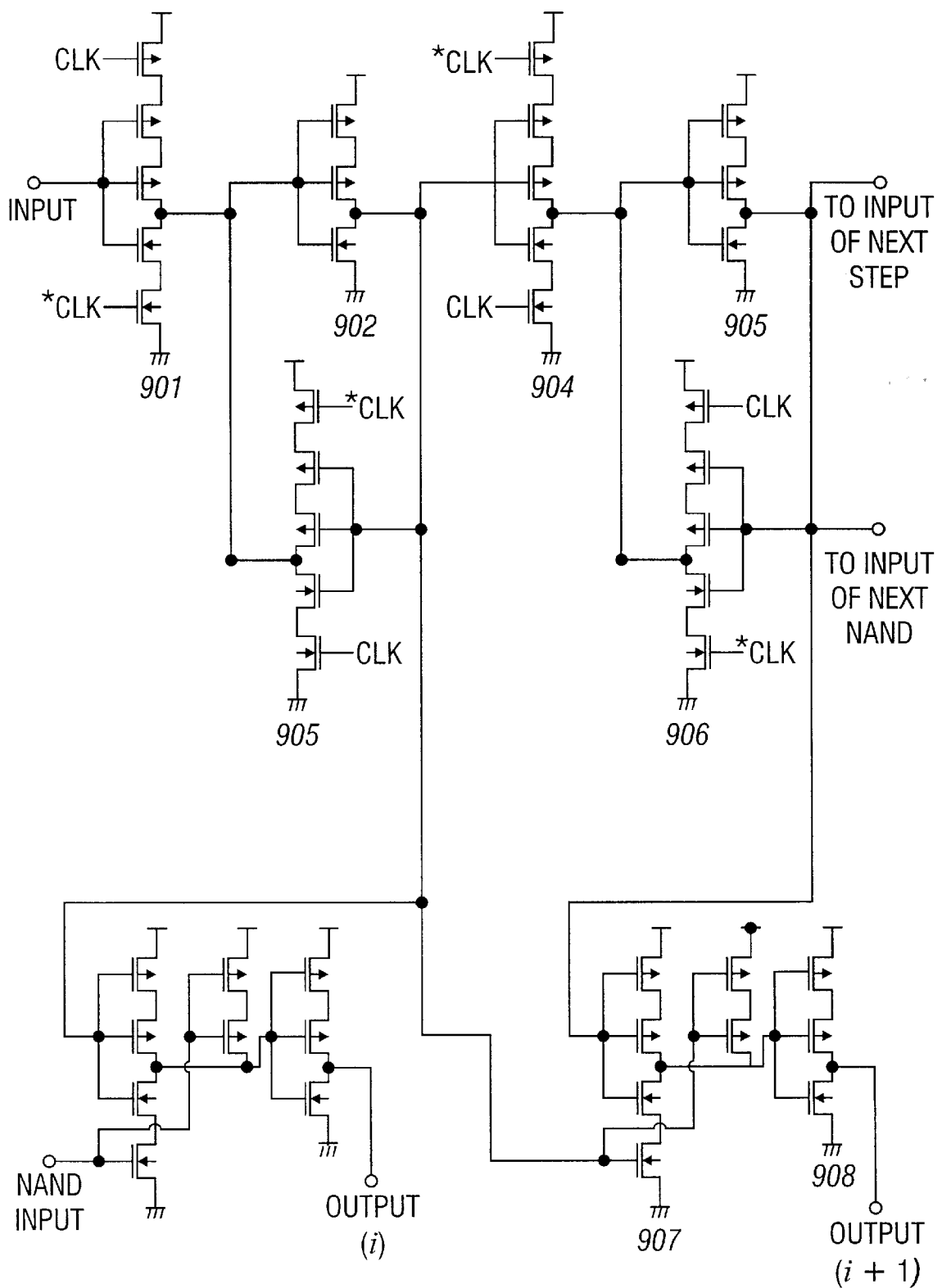

FIG. 9 is a circuit diagram showing the first stage of a shift register constituted of TFTs. A P-channel TFTs is inserted between a P-channel TFT and an N-channel TFT which constitute each of clocked inverters 901, 903, 904 and 906, inverters 902, 905 and 908, and a NAND 907. By virtue of a voltage drop of the inserted P-channel TFT, an electric field in the vicinity of the P-channel TFT can be weakened, reducing a leak current. Although in this embodiment an input signal is supplied to the gate electrode of the inserted P-channel TFT, a P-channel TFT that is always made ON-state may be inserted as in Embodiments 2 and 4. Further, a plurality of P-channel TFTs may be inserted.

Embodiment 10

Figure 10:
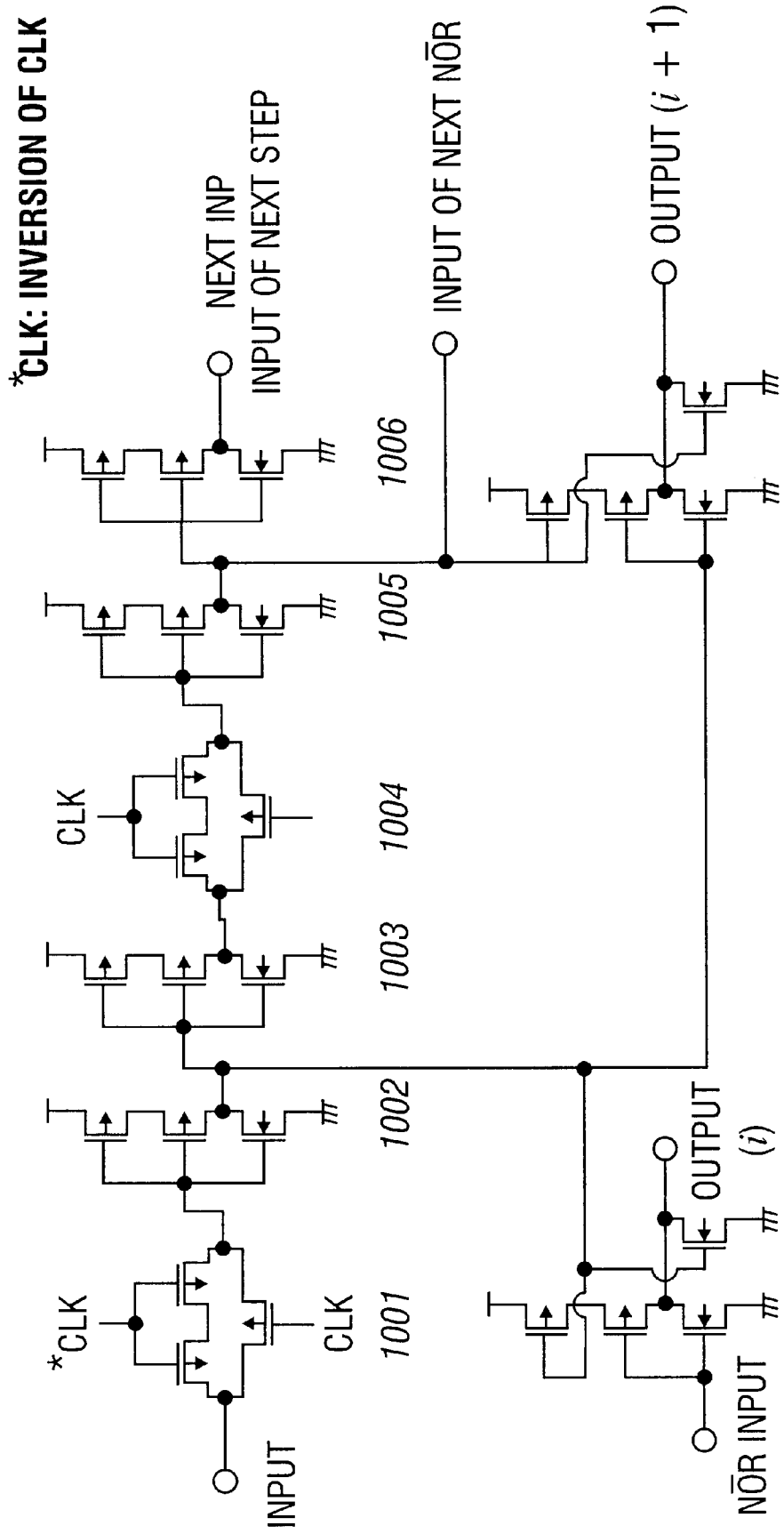

FIG. 10 is a circuit diagram showing the first stage of a shift register constituted of TFTs. A P-channel TFTs is inserted between a P-channel TFT and an N-channel TFT which constitute each of transfer gates 1001 and 1004, and inverters 1002, 1003, 1005 and 1006. By virtue of a voltage drop of the inserted P-channel TFT, an electric field in the vicinity of the P-channel TFT can be weakened, reducing a leak current. Although in this embodiment an input signal is supplied to the gate electrode of the inserted P-channel TFT, a P-channel TFT that is always made ON-state may be inserted as in Embodiments 2 and 7. Further, a plurality of P-channel TFTs may be inserted.

Embodiment 11

This embodiment relates to a method of introducing nickel as a catalyst element for accelerating crystallization of silicon, by using its solution. In this embodiment, in the state of FIG. 12A, the silicon oxide film 1204 is formed as an very thin film (thickness: several tens of angstrom). This oxide film 1204 may be formed by ultraviolet light illumination in an oxidizing atmosphere.

The oxide film 1204 is to prevent repulsion of a solution in the subsequent solution applying step. Then, nickel is rendered in contact with the surface of the amorphous silicon film 1101 through the very thin oxide film, 1204 by spin-coating a solution of a nickel acetate salt with a spinner. Thereafter, the crystallization step as described above in connection with FIG. 12B may be performed.

Embodiment 12

This embodiment is to introduce nickel by applying a solution of a nickel acetate salt in the step of FIG. 11A. The crystalline silicon film may be obtained as follows. After a nickel acetate salt solution is spin-coated with a spinner in the step of FIG. 11A, the amorphous silicon film 1104 is deposited and then subjected to the heat treatment.

Embodiment 13

In this embodiment, Pd is used as a catalyst element for accelerating crystallization of silicon. Although Pd is inferior to Ni in the effects and reproducibility, it can be used by virtue of its superior practicality. In this embodiment palladium is introduced by using a solution of palladium chloride ($PdCl_2$ $2H_2O$), which is known as a palladium salt.

Although Pd is used in this embodiment, where Fe (iron) is used as the catalyst element, there may be used a material selected from compounds of Fe known as iron salts such as ferrous bromide ($FeBr_2$ $6H_2O$), ferric bromide ($FeBr_3$ $6H_2O$), ferric acetate ($Fe(C_2H_3O_2)_3 \times H_2O$), ferrous chloride ($FeCl_2$ $4H_2O$), ferric chloride ($FeCl_3$ $6H_2O$), ferric fluoride ($FeF_3$ $3H_2O$), ferric nitrate ($Fe(NO_3)_3$ $9H_2O$), ferrous phosphate ($Fe_3(PO_4)_2$ $8H_2O$), and ferric phosphate ($FePO_4$ $2H_2O$).

Where Co (cobalt) is used as the catalyst element, there may be used a material selected from compounds of Co known as cobalt salts such as cobalt bromide ($CoBr$ $6H_2O$), cobalt acetate ($Co(C_2H_3O_2)_2$ $4H_2O$), cobalt chloride ($CoCl_2$ $6H_2O$), cobalt fluoride ($CoF_2$ $\times H_2O$), and cobalt nitrate ($Co(NO_3)_2$ $6H_2O$).

Where Ru (ruthenium) is used as the catalyst element, there may be used its compound known as a ruthenium salt such as ruthenium chloride ($RuCl_3$ $H_2O$).

Where Rh (rhodium) is used as the catalyst element, there may be used its compound known as a rhodium salt such as rhodium chloride ($RhCl_3$ $3H_2O$).

Where Os (osmium) is used as the catalyst element, there may be used its compound known as an osmium salt such as osmium chloride ($OsCl_3$).

Where Ir (iridium) is used as the catalyst element, there may be used a material selected from compounds of Ir known as iridium salts such as iridium trichloride ($IrCl_3$ $3H_2O$) and iridium tetrachloride ($IrCl_4$).

Where Pt (Platinum) is used as the catalyst element, there may be used its compound known as a platinum salt such as platinic chloride ($PtCl_4$ $5H_2O$).

Where Cu (copper) is used as the catalyst element, there may be used a material selected from compounds of Cu such as cupric acetate ($Cu(CH_3COO)_2$), cupric chloride ($CuCl_2$ $2H_2O$), and cupric nitrate ($Cu(NO_3)_2$ $3H_2$)).

Where Au (gold) is used as the catalyst element, there may be used a material selected from compounds of Au such as gold trichloride ($AuCl_3$ $\times H_2O$), and a gold chloride salt ($AuHCl_4$ $4H_2O$).

Figure 13:
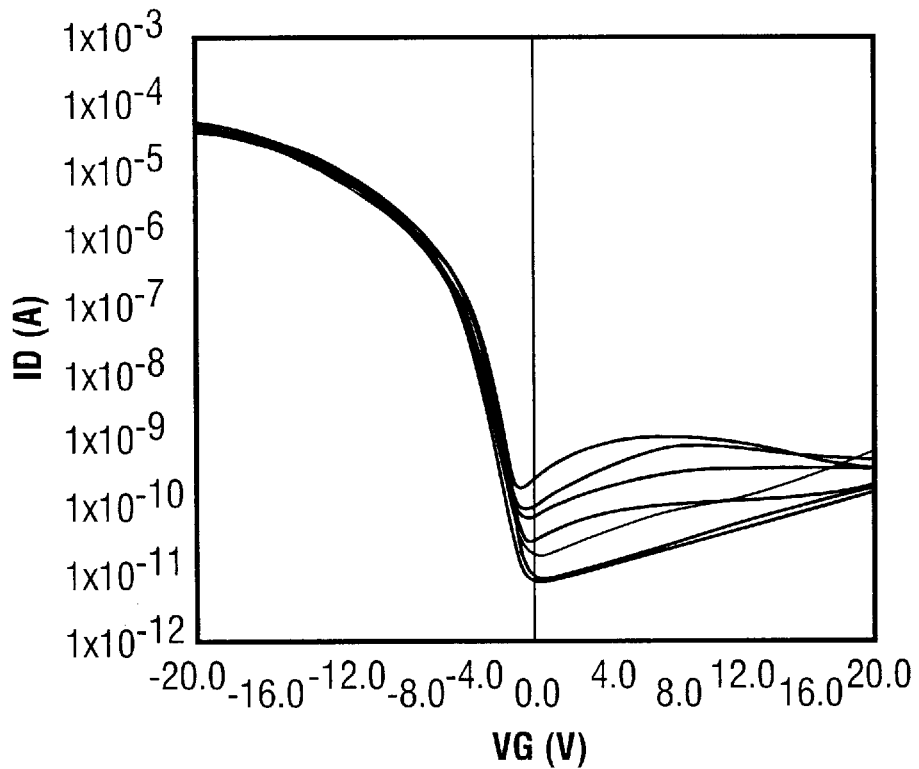
FIG. 13 shows a variation of the leak current of a conventional P-channel TFT.
Figure 14:
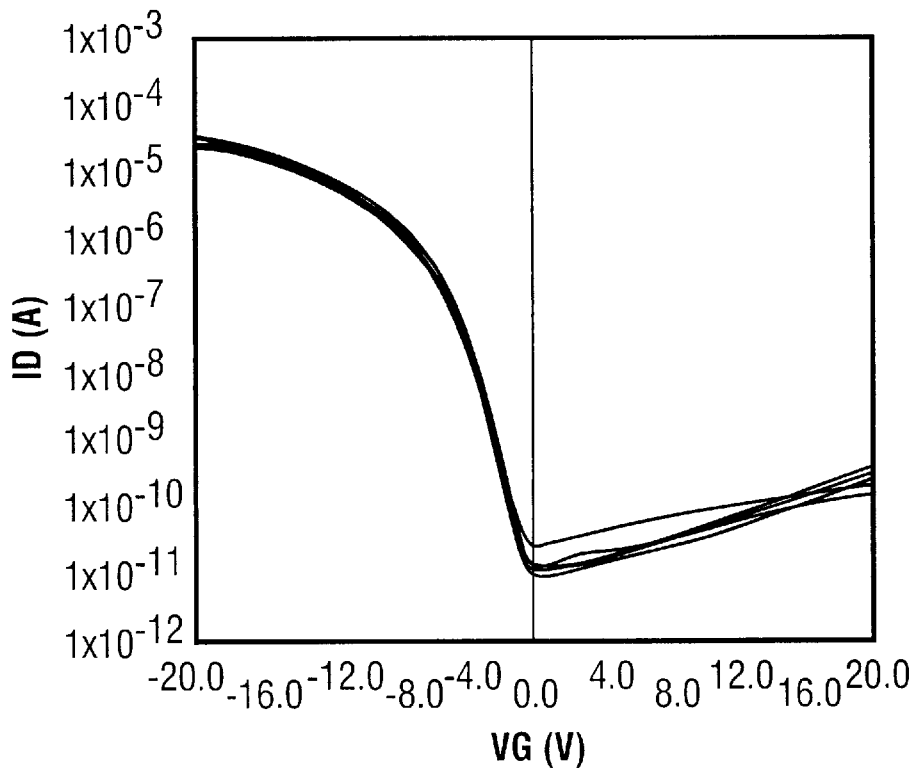
FIG. 14 shows a variation of the leak current of a P-channel TFT according to the invention.

As described above, according to the invention, by inserting a P-channel TFT between a P-channel TFT and an N-channel TFT, a voltage drop is caused and, as a result, an electric field in the vicinity of the drain of the P-channel TFT is weakened. Thus, the leak current can be reduced. FIG. 14 shows a variation of the leak current in a case where two P-channel TFTs are connected in series. It is understood from FIG. 14 that the leak current variation is within one order. The advantage of the invention is apparent from the comparison between FIGS. 13 and 14. Thus, the invention can also reduce the power consumption of thin film semiconductor integrated circuits.

What is claimed is:

1. A thin film semiconductor integrated circuit including at least one N-channel thin film transistor and first and second P-channel thin film transistors operatively connected to each other and formed on a substrate with one of the source or drain regions of the first P-channel thin film transistor connecting to one of the source or drain regions of the second P-channel thin film transistor for reducing a leak current, and at least an extra leakage suppressing P-channel thin film transistor in an ON-state and connected at a predetermined location relative to the N-channel, the first and second thin film transistors, each of said thin film transistors comprising:

a crystalline semiconductor layer including at least a source, a drain and a channel regions therein wherein said semiconductor layer contains a catalyst metal capable of promoting silicon crystallization in a concentration not higher than $5 \times 10^{19}$ atoms/cm$^3$;

a gate insulating film adjacent to the channel region; and a gate electrode adjacent to the gate insulating film, gate electrode of the first P-channel thin film transistor is electrically isolated from the gate electrode of the second p-channel thin film transistor.

2. The thin film semiconductor integrated circuit according to claim 1, wherein the catalyst element is one or a plurality of elements selected from the group consisting of Fe, Co, Ni, Ru. Rh, Pd, Os, Ir, Pt, Cu and Au.

3. The thin film semiconductor integrated circuit according to claim 1, wherein said crystalline silicon contains hydrogen or a halogen element at 0.001 to 5 atomic %.

4. The thin film semiconductor integrated circuit according to claim 5, wherein the gate electrode of the first P-channel thin film transistor is connected to a voltage source while the gate electrode of the second transistor is fixed to a ground level.

5. The thin film semiconductor integrated circuit according to claim 1, wherein said circuit is an inverter circuit.

6. A thin film semiconductor integrated circuit according to claim 1 wherein said circuit is a NAND circuit.

7. A thin film semiconductor integrated circuit according to claim 1 wherein said circuit is a transfer gate circuit.

8. A thin film semiconductor integrated circuit according to claim 1 wherein said circuit is an inverter circuit.

9. A thin film semiconductor integrated circuit according to claim 1 wherein said circuit is a NAND circuit.

10. A thin film semiconductor integrated circuit according to claim 1 wherein said circuit is a transfer gate circuit.

11. A thin film semiconductor integrated circuit, comprising:

A first thin film transistor circuit having at least one first P-channel thin film transistor, a first signal input terminal, and a first output terminal for outputting a first output signal;

A second thin film transistor circuit having at least one second N-channel thin film transistor, a second signal input that shares the first input signal with the first signal input terminal of the first thin film transistor circuit, and a second output terminal for outputting a second output signal;

at least one first additional P-channel thin film transistor being inserted and connected between the first and second output terminals of the first and second thin film transistor circuits; and at least one second additional leakage suppressing P-channel thin film transistor, in an ON-state, and connected to the second thin film transistor circuit.

12. A thin film semiconductor integrated circuit, comprising:

A first thin film transistor circuit having at least one first P-channel thin film transistor, a first signal input terminal, and a first output terminal for outputting a first output signal;

A second thin film transistor circuit having at least one second N-channel thin film transistor, a second signal input that shares the first input signal with the first signal input terminal of the first thin film transistor circuit, and a second output terminal for outputting a second output signal;

at least one first additional P-channel thin film transistor being inserted and connected between the first and second output terminals of the first and second thin film transistor circuits; and at least one second additional leakage suppressing P-channel thin film transistor that is in an ON-state is connected to the first thin film transistor circuit.

* * * * *